United States Patent
Lin

(10) Patent No.: US 12,007,289 B2
(45) Date of Patent: Jun. 11, 2024

(54) TEMPERATURE MEASUREMENT AND TEMPERATURE CALIBRATION METHODS AND TEMPERATURE MEASUREMENT SYSTEM

(71) Applicant: CHANGXIN MEMORY TECHNOLOGIES, INC., Hefei (CN)

(72) Inventor: ShihChieh Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/385,022

(22) Filed: Jul. 26, 2021

(65) Prior Publication Data

US 2021/0348972 A1 Nov. 11, 2021

Related U.S. Application Data

(63) Continuation of application No. PCT/CN2021/080352, filed on Mar. 12, 2021.

(30) Foreign Application Priority Data

Mar. 19, 2020 (CN) .......................... 202010196026.3

(51) Int. Cl.
*G01K 19/00* (2006.01)
*G01K 1/14* (2021.01)
(Continued)

(52) U.S. Cl.
CPC ............... *G01K 19/00* (2013.01); *G01K 1/14* (2013.01); *G01K 7/16* (2013.01); *G01K 7/18* (2013.01);
(Continued)

(58) Field of Classification Search
CPC ............ G01K 19/00; G01K 1/14; G01K 7/16; G01K 7/18; G01K 15/002; G01K 15/005;
(Continued)

(56) References Cited

U.S. PATENT DOCUMENTS 5,435,646 A * 7/1995 McArthur ................ G01K 7/22
374/185
6,124,793 A * 9/2000 Knutson ................. C23C 16/46
73/1.01

(Continued)

FOREIGN PATENT DOCUMENTS

CN 101677242 A 3/2010
CN 1956146 B 8/2011
(Continued)

OTHER PUBLICATIONS

International Search Report in the international application No. PCT/CN2021/080352, mailed on Jun. 23, 2021.
(Continued)

*Primary Examiner* — Nathaniel T Woodward
*Assistant Examiner* — Philip L Cotey
(74) *Attorney, Agent, or Firm* — Syncoda LLC; Feng Ma

(57) ABSTRACT

A temperature measurement method includes: a temperature calibrator with a first test structure of which a resistance forms a first functional relationship with a temperature is placed on a stage in a chamber; a temperature of the chamber is made to reach a set temperature; a voltage is applied to two opposite ends of the first test structure to obtain a corresponding current and a corresponding resistance; and an actual temperature of the temperature calibrator is acquired according to the resistance and the first functional relationship.

6 Claims, 11 Drawing Sheets

(51) Int. Cl.

| | | |
|---|---|---|
| *G01K 7/16* | (2006.01) | |
| *G01K 7/18* | (2006.01) | |
| *G01K 15/00* | (2006.01) | |
| *G01R 31/00* | (2006.01) | |
| *G01R 31/26* | (2020.01) | |
| *H01L 21/687* | (2006.01) | |
| *H01L 21/67* | (2006.01) | |

(52) U.S. Cl.
CPC ......... *G01K 15/002* (2013.01); *G01K 15/005* (2013.01); *G01R 31/00* (2013.01); *G01R 31/003* (2013.01); *G01R 31/26* (2013.01); *G01R 31/2601* (2013.01); *H01L 21/68714* (2013.01); *H01L 21/67248* (2013.01)

(58) Field of Classification Search
CPC ...... G01R 31/00; G01R 31/003; G01R 31/26; G01R 31/2601; H01L 21/68714; H01L 21/67248
See application file for complete search history.

(56) References Cited

U.S. PATENT DOCUMENTS

| | | | | |
|---|---|---|---|---|
| 6,164,816 | A * | 12/2000 | Aderhold | G01J 5/0007 374/1 |
| 7,030,793 | B2 * | 4/2006 | McLeod | G01K 15/00 374/E7.035 |
| 7,492,176 | B2 * | 2/2009 | Chiba | G01R 31/2865 324/750.28 |
| 10,366,867 | B2 * | 7/2019 | Criminale | H01L 22/20 |
| 10,677,664 | B1 * | 6/2020 | Wong | G01K 15/005 |
| 10,872,747 | B2 * | 12/2020 | Linebarger, Jr. | H01L 21/67103 |
| 11,125,628 | B2 * | 9/2021 | Takeuchi | G01K 7/01 |
| 2005/0179575 | A1 * | 8/2005 | McLeod | G01K 7/01 374/E7.035 |
| 2006/0019415 | A1 * | 1/2006 | Jaiswal | H01L 28/20 374/E7.018 |
| 2007/0030621 | A1 * | 2/2007 | Gaff | H01L 21/67248 361/234 |
| 2007/0075797 | A1 * | 4/2007 | Matsuya | H03L 1/025 331/158 |
| 2008/0248599 | A1 * | 10/2008 | Jaiswal | H01L 28/20 374/E7.018 |
| 2010/0066433 | A1 * | 3/2010 | Mochizuki | H03F 1/301 327/512 |
| 2018/0053636 | A1 * | 2/2018 | Criminale | H01L 21/67103 |
| 2019/0154518 | A1 * | 5/2019 | Takeuchi | G01K 7/01 |
| 2019/0295824 | A1 * | 9/2019 | Criminale | H01J 37/32935 |
| 2019/0331535 | A1 * | 10/2019 | Zhuang | A61M 16/1095 |
| 2020/0051789 | A1 * | 2/2020 | Linebarger, Jr. | G01K 1/14 |
| 2020/0278380 | A1 * | 9/2020 | Østerberg | G01R 1/06794 |

FOREIGN PATENT DOCUMENTS

| | | |
|---|---|---|
| CN | 103050423 A | 4/2013 |
| CN | 103280413 A | 9/2013 |
| CN | 103808425 A | 5/2014 |
| CN | 104051298 A | 9/2014 |
| CN | 105097421 A | 11/2015 |
| CN | 106501699 A | 3/2017 |
| CN | 106505018 A | 3/2017 |
| CN | 106771942 A | 5/2017 |
| CN | 106840439 A | 6/2017 |
| CN | 107091697 A | 8/2017 |
| CN | 107331595 A | 11/2017 |
| CN | 108803260 A | 11/2018 |
| CN | 109084911 A | 12/2018 |
| CN | 109186790 A | 1/2019 |
| CN | 109540961 A | 3/2019 |
| CN | 109643668 A | 4/2019 |
| CN | 109659244 A | 4/2019 |
| CN | 110085531 A | 8/2019 |
| CN | 110274705 A | 9/2019 |
| CN | 110600419 A | 12/2019 |
| CN | 110888470 A | 3/2020 |
| JP | 2012256799 A | 12/2012 |
| JP | 2014190801 A | 10/2014 |
| TW | 421832 B | 2/2001 |
| TW | 440685 B | 6/2001 |
| TW | M528516 U | 9/2016 |
| WO | 2018086666 A1 | 5/2018 |
| WO | 2020033304 A1 | 2/2020 |

OTHER PUBLICATIONS

International Search Report in the international application No. PCT/CN2021/080389, mailed on May 8, 2021.

Cheng. Lu et al.Non-official translation: "Conversion from Nonlinear Thermistors to Linear Temperature Sensors" (Science and Technology), vol. 28, No. 31, Oct. 10, 2016 (Oct. 10, 2016),ISSN: 1672-8289.

Jia, Jingcai et al."Wafer Temperature Monitoring Technology in Integrated Circuit Manufacturing Process" Chinese Journal of Scientific Instrument, vol. 42, No. 1, Jan. 31, 2021 (Jan. 31, 2021),ISSN: 0254-3087.

First Office Action of the Chinese application No. 202010196028.2, issued on Feb. 14, 2022.

International Search Report in the international application No. PCT/CN2021/079968, mailed on May 27, 2021.

International Search Report in the international application No. PCT/CN2021/079969, mailed on Jun. 10, 2021.

* cited by examiner

TEMPERATURE MEASUREMENT AND TEMPERATURE CALIBRATION METHODS AND TEMPERATURE MEASUREMENT SYSTEM

CROSS-REFERENCE TO RELATED APPLICATIONS

This is a continuation of International Patent Application No. PCT/CN2021/080352 filed on Mar. 12, 2021, which claims priority to Chinese Patent Application No. 202010196026.3 filed on Mar. 19, 2020. The disclosures of these applications are hereby incorporated by reference in their entirety.

BACKGROUND

A temperature calibration for a process chamber of a semiconductor device typically involves placing multiple temperature calibrators on a stage of the device, the temperature calibrators typically distributed at five points or nine points on the stage, and performing temperature calibration on the process chamber by using the temperature calibrators to ensure the same temperature everywhere on the stage.

SUMMARY

The present disclosure relates to the technical field of semiconductors, and more specifically to temperature measurement and temperature calibration methods and a temperature measurement system.

An aspect of the disclosure provides a method for temperature measurement, which may include the following operations.

A temperature calibrator is placed on a stage in a chamber, the temperature calibrator being provided with a first test structure, and a first functional relationship between resistance of the first test structure and a temperature is acquired.

A temperature of the chamber is made to reach a set temperature.

A voltage V is applied to two opposite ends of the first test structure to obtain a current I and resistance R of the first test structure.

An actual temperature T corresponding to the temperature calibrator at the set temperature is acquired according to the resistance R and the first functional relationship.

The set temperature may be greater than or equal to a minimum critical temperature endurable by the temperature calibrator and less than or equal to a maximum critical temperature endurable by the temperature calibrator.

Another aspect of the disclosure provides a method for temperature calibration, which may be used to calibrate a temperature of a stage in a process chamber of a semiconductor device. The process chamber of the semiconductor device may be provided with a temperature control device. The method for temperature calibration may include an operation that temperature measurement is performed by using W temperature calibrators, temperature measurement being implemented using the abovementioned method for temperature measurement. The method for temperature calibration may further include the following operations.

A first temperature distribution is obtained according to actual temperatures T corresponding to X temperature calibrators when a temperature of the chamber reaches a first set temperature.

A second temperature distribution is obtained according to actual temperatures T corresponding to Y temperature calibrators when the temperature of the chamber reaches a second set temperature.

The temperature control device is adjusted according to the first temperature distribution and the second temperature distribution to able that all the actual temperatures T corresponding to the X temperature calibrators tend to be the first set temperature when the temperature of the chamber reaches the first set temperature and all the actual temperatures T corresponding to the Y temperature calibrators tend to be the second set temperature when the temperature of the chamber reaches the second set temperature.

Both X and Y may be less than or equal to W.

In one embodiment, the X temperature calibrators and/or the Y temperature calibrators may be uniformly distributed on the stage.

Another aspect of the disclosure provides a system for temperature measurement, which may include a setting circuit, a temperature control circuit, a measurement circuit, and a calculation circuit.

The setting circuit may be configured to set a set temperature of a chamber, a position of a first test structure corresponding to the set temperature, and a voltage V applied to two opposite ends of the first test structure, the first test structure referring to a structure which is located on a temperature calibrator placed on a stage and of which resistance of temperature calibrator forms a first functional relationship with a temperature.

The temperature control circuit may be configured to control a temperature of the chamber to reach the set temperature.

The measurement circuit may be configured to apply the voltage V to the two opposite ends of the first test structure to obtain a current I and resistance R of the first test structure at the set temperature.

The calculation circuit may be configured to acquire the first functional relationship, the voltage V, and the resistance R, and to calculate an actual temperature T corresponding to the temperature calibrator at the set temperature.

The set temperature may be greater than or equal to a minimum critical temperature endurable by the temperature calibrator and less than or equal to a maximum critical temperature endurable by the temperature calibrator.

Details of one or more embodiments of the disclosure are set forth in the accompanying drawings and the description below. Other features, objects, and advantages of the present disclosure will be apparent according to the specification, the accompanying drawings, and the claims.

BRIEF DESCRIPTION OF THE DRAWINGS

In order to describe and illustrate the embodiments of the disclosure better, references can be made to one or more drawings. However, appended details or examples for describing the drawings should not be considered as limits to the scope of the creative invention of the application and any one of presently described embodiments or preferred modes.

DETAILED DESCRIPTION

Figure 1:
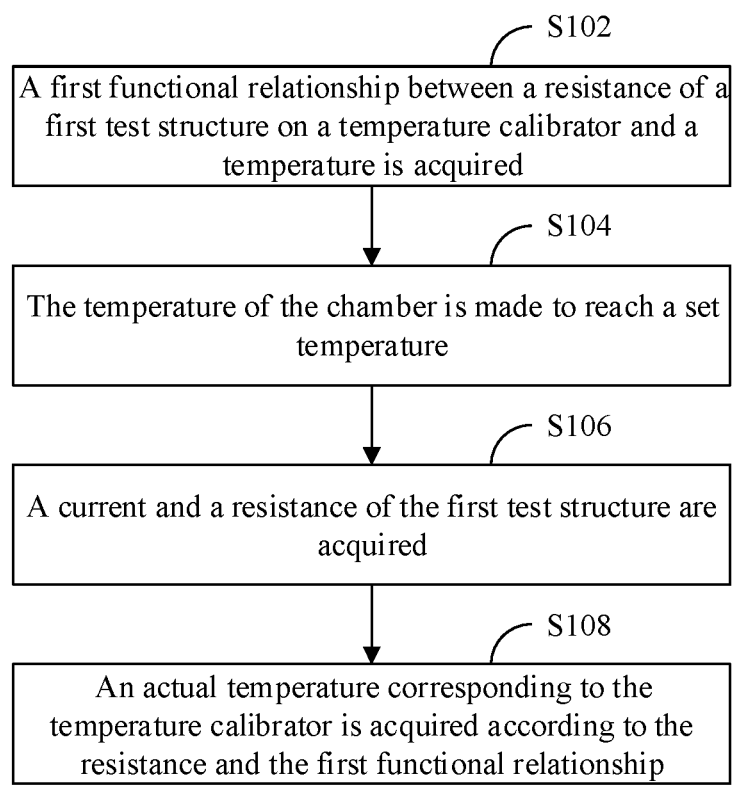
FIG. 1 is a flowchart of a method for temperature measurement according to an embodiment.

For ease of understanding of the present disclosure, the disclosure will be described more comprehensively below with reference to the related drawings. The drawings show preferred embodiments of the disclosure. However, the disclosure may be implemented in various forms and is not limited to the embodiments described herein. Instead, these embodiments are provided to make the contents disclosed in the disclosure understood more thoroughly and comprehensively.

Unless otherwise defined, all technical and scientific terms used herein have the same meanings as commonly understood by those skilled in the art that the disclosure belongs to. Herein, terms used in the description of the disclosure are only for the purpose of describing specific embodiments and not intended to limit the disclosure. As used herein, the term "and/or" includes any and all combinations of one or more of the associated listed items.

It should be understood that when an element or layer is referred to as being "on", "adjacent to", "connected to", or "coupled to" another element or layer, the element or layer may be directly on, adjacent to, connected to, or coupled to the other element or layer, or intervening elements or layers may be present. In contrast, when an element is referred to as being "directly on", "directly adjacent to", "directly connected to", or "directly coupled to" another element or layer, there are no intervening elements or layers present. It should be understood that although the terms first, second, third, etc. may be used to describe various elements, components, regions, layers, and/or portions, these elements, components, regions, layers, and/or portions should not be limited by these terms. These terms are used merely to distinguish one element, component, region, layer, or portion from another element, component, region, layer, or portion. Therefore, a first element, component, region, layer, or portion discussed below may be represented as a second element, component, region, layer, or portion without departing from the teachings of the present disclosure.

Spatially relational terms such as "below", "under", "lower", "beneath", "above", and "upper" may be used herein for convenience of description to describe a relationship between one element or feature and another element or feature illustrated in the figures. It is to be understood that, in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

The terms used herein are for the purpose of describing particular embodiments only and are not intended to be limiting of the present disclosure. As used herein, the singular forms "a/an", "one", and "the" are also intended to include the plural forms as well, unless the context clearly dictates otherwise. It should also be understood that when the terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, the term "and/or" includes any and all combinations of the associated listed items.

Temperature calibration accuracy of typically temperature calibration approaches can be relatively low, usually ±0.05° C.

As shown in FIG. 1, in an embodiment, there is provided a method for temperature measurement, which includes the following operations.

In S102, a first functional relationship between a resistance of a first test structure on a temperature calibrator and a temperature is acquired.

The temperature calibrator is placed on a stage in a chamber, the temperature calibrator is provided with the first test structure, and the first functional relationship between the resistance of the first test structure and the temperature of the first test structure is acquired. In an embodiment, the temperature calibrator is placed at different positions on the stage as practically required, for example, a central position of the stage.

Figure 2:
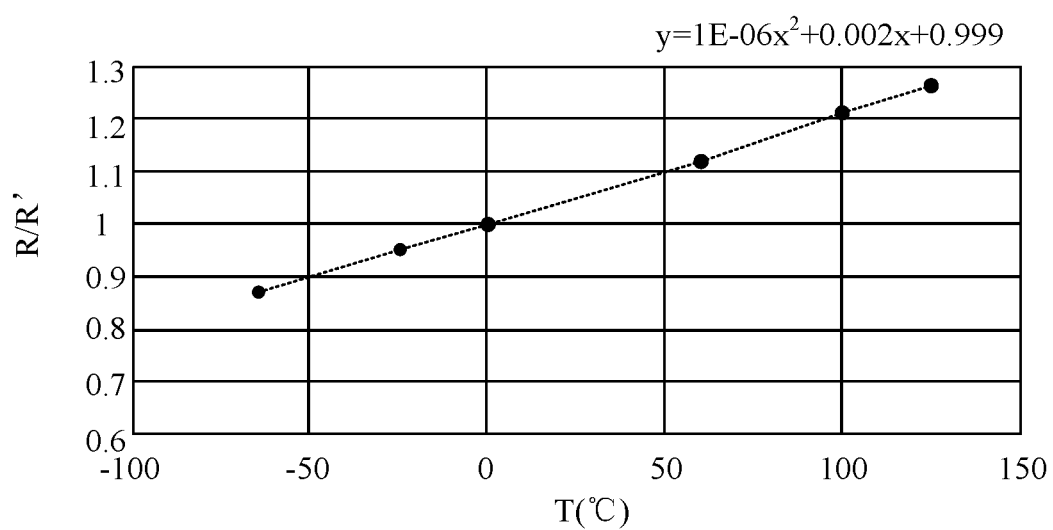
FIG. 2 is a schematic diagram of changing of a ratio of resistance of a first test structure to resistance R0 with temperature according to an embodiment.

As shown in FIG. 2, in an embodiment, the first test structure is an N+ doped resistance structure, and resistance R0 of the first test structure at 25° C. is a constant. A first change of a ratio of the resistance to resistance R0 of the first test structure with temperature is $Y=1E-06X^2+0.002X+0.999$. In the figure, the X axis is the temperature, and the Y axis is the ratio of the resistance to resistance R0 of the first test structure.

In an embodiment, a doping concentration of the first test structure may be adjusted to obtain different first functional relationships.

In an embodiment, the resistance of the first test structure regularly changes with temperature in a certain temperature range (for example, −150° C. to 150° C., or −100° C. to 100° C.).

In an embodiment, a size of the stage is related to a size of a wafer carried on the stage. For example, the stage is a stage that carries an 8-inch wafer or a stage that carries a 12-inch wafer.

Figure 3:
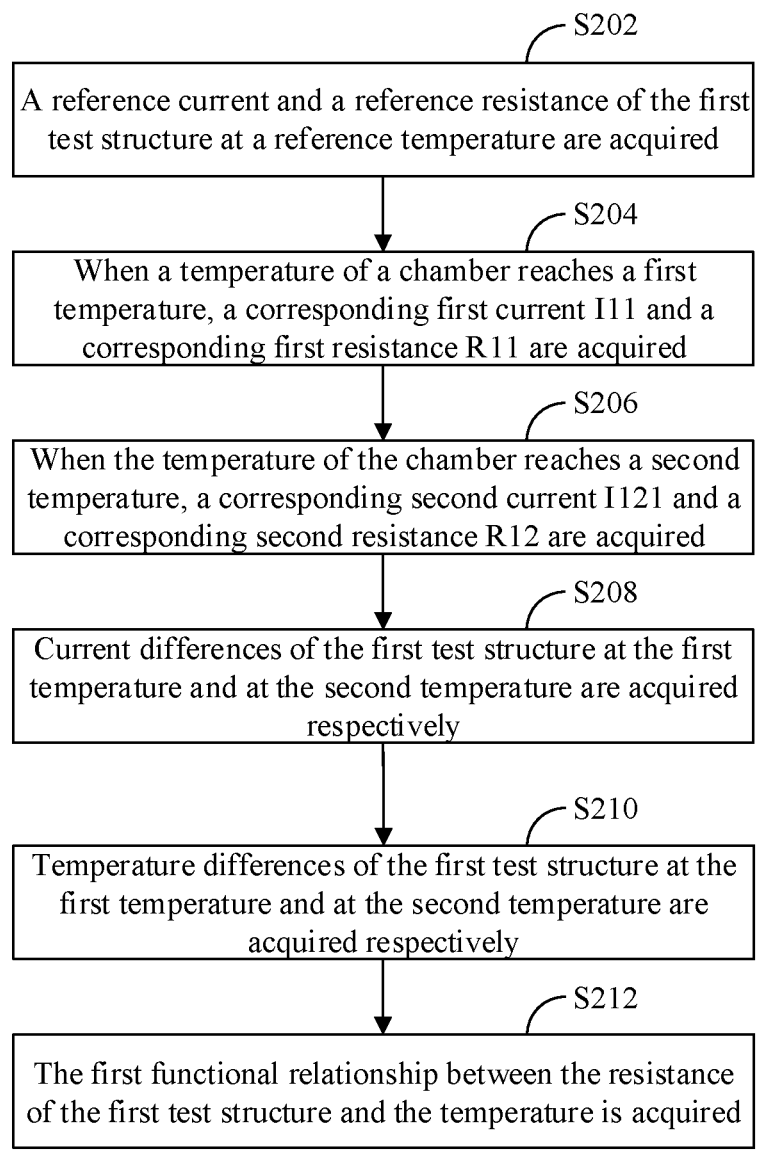
FIG. 3 is a flowchart of acquiring a first functional relationship between a resistance of a first test structure and a temperature of the first test structure on a temperature calibrator according to an embodiment.

As shown in FIG. 3, S102 includes the following operations.

In S202, a reference current and a reference resistance of the first test structure at a reference temperature are acquired.

At the reference temperature T0, a voltage V is applied to two opposite ends of the first test structure to obtain the corresponding reference current I01 and reference resistance R01. In an embodiment, the reference temperature T0 is a temperature when the chamber is idle, for example, 25° C.

In S204, when a temperature of the chamber reaches a first temperature, a corresponding first current I11 and a corresponding first resistance R11 are acquired.

The temperature of the chamber is made to reach the first temperature, and the voltage V is applied to the two opposite ends of the first test structure to obtain the corresponding first current I11 and the corresponding first resistance R11.

In S206, when the temperature of the chamber reaches a second temperature, a corresponding second current I21 and a corresponding second resistance R12 are acquired.

The temperature of the chamber is made to reach the second temperature, and the voltage V is applied to the two opposite ends of the first test structure to obtain the corresponding second current I12 and the corresponding second resistance R12.

In S208, current differences of the first test structure at the first temperature and at the second temperature are acquired respectively.

The first current difference ΔI11 of the first test structure at the first temperature and the second current difference ΔI12 at the second temperature are acquired according to a difference between the first current I11 and the reference current I01, and a difference between the second current I12 and the reference current I01 respectively, namely ΔI11=I11−I01, and ΔI12=I12−I01. Both the first temperature and the second temperature are greater than or equal to a minimum critical temperature endurable by the temperature calibrator and less than or equal to a maximum critical temperature endurable by the temperature calibrator.

In S210, temperature differences of the first test structure at the first temperature and the second temperature are acquired respectively.

A difference ΔT11 (i.e., the temperature difference of the first test structure at the first temperature) between a first actual temperature T11 corresponding to the first resistance R11 and T0 is acquired according to a product of a negative of a ratio of the voltage V to the first current difference ΔI11 and a current resolution, namely ΔT11=−(V/ΔI11)*current resolution; and a difference ΔT12 (i.e., the temperature difference of the first test structure at the second temperature) between a second actual temperature T12 corresponding to the second resistance R12 and T0 is acquired according to a product of a negative of a ratio of the voltage V to the second current difference ΔI12 and a current resolution, namely ΔT12=−(V/ΔI12)*current resolution. The current resolution refers to the accuracy of measuring the current of the first test structure by a test device.

In S212, the first functional relationship between the resistance of the first test structure and the temperature is acquired.

Linear fitting is performed on the reference resistance R01, the first resistance R11, and the second resistance R12 as well as the reference temperature T0, the first actual temperature T11, and the second actual temperature T12 to obtain the first functional relationship between the resistance R of the first test structure and an actual temperature T.

In an embodiment, the first functional relationship between the resistance R of the first test structure and the actual temperature T is obtained by performing linear fitting through a least square method.

In S104, the temperature of the chamber is made to reach a set temperature.

The temperature of the chamber is made to reach any set temperature greater than or equal to the minimum critical temperature endurable by the temperature calibrator and less than or equal to the maximum critical temperature endurable by the temperature calibrator, such as −40° C., −20° C., 0° C., 10° C., 25° C., 50° C., 85° C., 100° C., 125° C., or 150° C.

In an embodiment, the set temperature is a process temperature of the chamber.

In S106, a current and resistance of the first test structure are acquired.

The voltage V is applied to the two opposite ends of the first test structure to obtain the current I and resistance R of the first test structure. The resistance R of the first test structure may be acquired through the voltage V applied to the two ends of the first test structure and the corresponding current I.

In S108, an actual temperature corresponding to the temperature calibrator is acquired according to the resistance and the first functional relationship.

The actual temperature T corresponding to the temperature calibrator at the set temperature is acquired according to the resistance R and the first functional relationship. Specifically, a temperature value corresponding to the resistance R, i.e., an actual temperature value of the first test structure, is obtained in combination with the first functional relationship between the resistance of the first test structure and the temperature and the resistance R of the first test structure. The first test structure is a test structure on the temperature calibrator, so the actual temperature value corresponding to the first test structure at the set temperature is the actual temperature T of the temperature calibrator at the set temperature.

Figure 4:
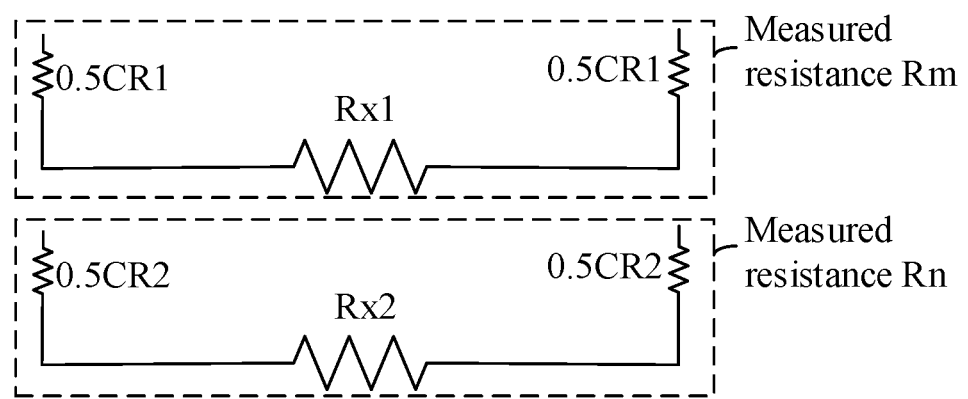
FIG. 4 is a schematic decomposition diagram of measured resistance Rm of a test structure 1 and measured resistance Rn of a test structure 2 according to an embodiment.

For different measurement situations and conditions, two resistances are measured at the same temperature of the chamber to obtain a resistance difference of the two resistances to eliminate the influence of a measurement error, for example, the influence of contact resistance such as probe resistance, on the resistance of the test structure. For example, after the temperature of the chamber reaches the set temperature, voltages are applied to two ends of two test structures, respectively, to acquire a resistance difference of two resistances. FIG. 4 shows a schematic decomposition diagram of measured resistance Rm of a test structure 1 and Rn of a test structure 2. Equivalent resistance of the test structure 1 is Rx1, and the resistance applied between the voltage output end of the test structure 1 and the test structure 1 is equivalent to contact resistance CR1, namely resistance between one end of the resistance Rx1 and one output end of the voltage is 0.5CR1. Equivalent resistance of the test structure 2 is Rx2, and the resistance applied between the voltage output end of the test structure 2 and the test structure 2 is equivalent to contact resistance CR21, namely resistance between one end of the resistance Rx2 and one output end of the voltage is 0.5CR2. A resistance difference of the measured resistance Rm and Rn (i.e., a resistance difference of the test structure 1 and the test structure 2) is Rs(t)=Rm−Rn=(Rx1+CR1)−(Rx2+CR2). If the contact resistance CR1 is equal to the contact resistance CR2, namely the resistance difference is Rs(t)=Rx−Rx2, a change trend between the resistance difference of the test structure 1 and the test structure 2 and the temperature may be obtained according to a change trend between the resistance and the temperature.

Figure 5:
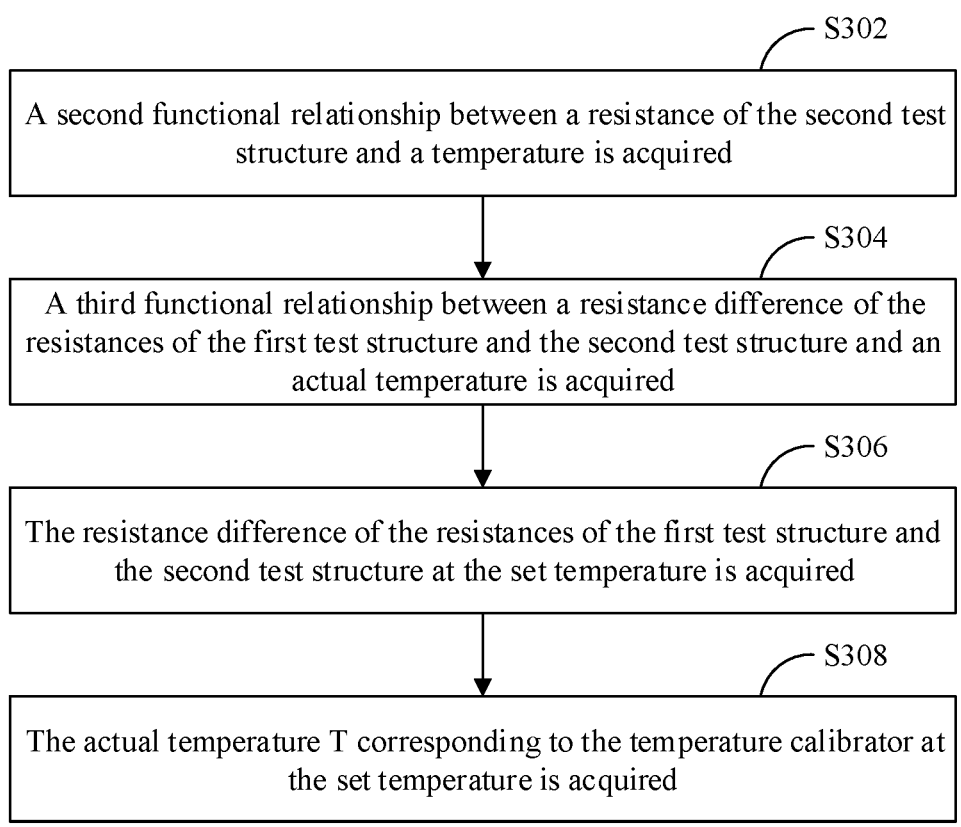
FIG. 5 is a flowchart of a method for temperature measurement according to another embodiment.

As shown in FIG. 5, in an embodiment, the temperature calibrator further includes a second test structure, and the method further includes the following operations.

In S302, a second functional relationship between a resistance of the second test structure and a temperature is acquired.

In an embodiment, the second test structure and the first test structure are test structures having the same structure on the same temperature calibrator.

Figure 6:
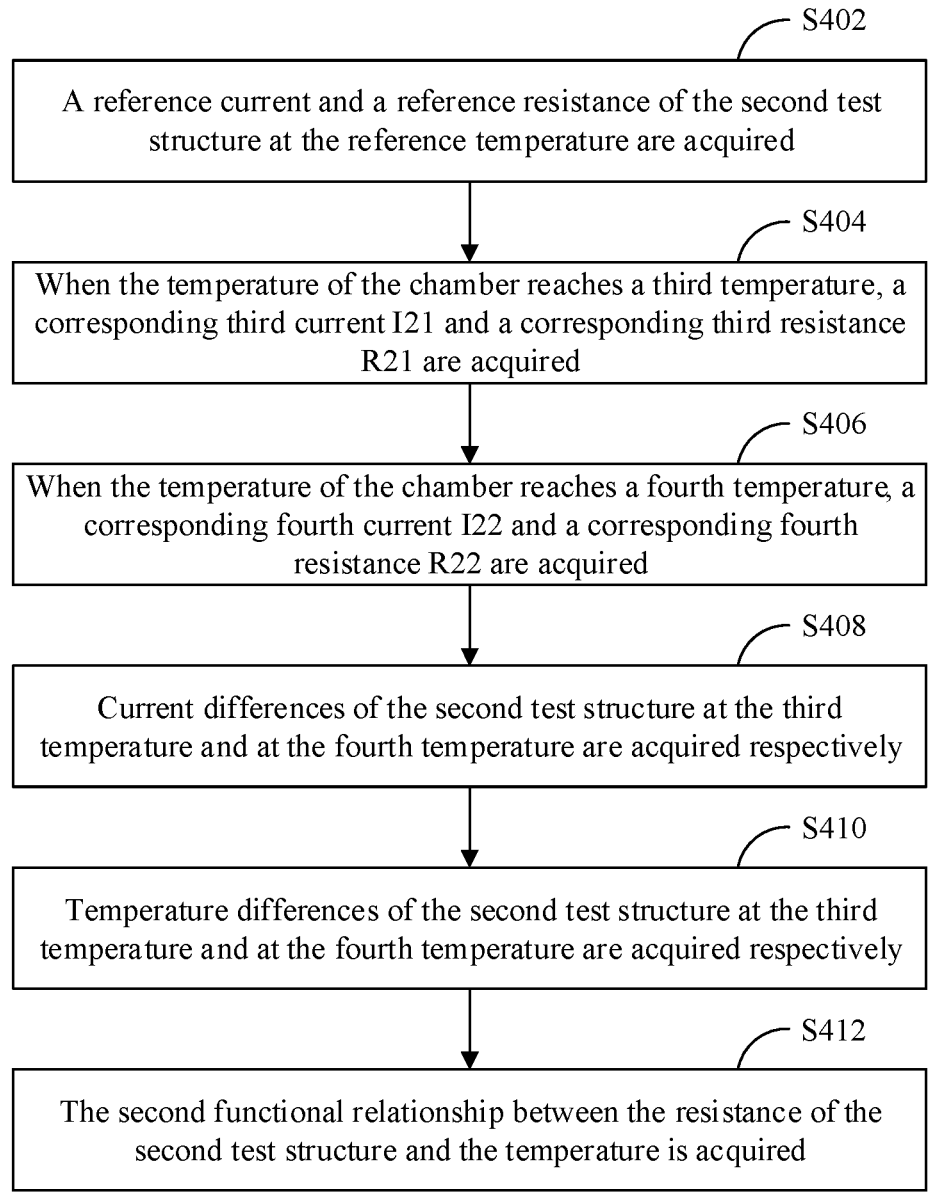
FIG. 6 is a flowchart of acquiring a second functional relationship between a resistance of a second test structure and a temperature of the second test structure according to an embodiment.

As shown in FIG. 6, in an embodiment, S302 includes the following operations.

In S402, a reference current and reference resistance of the second test structure at the reference temperature are acquired.

At the reference temperature T0, the voltage V is applied to two opposite ends of the second test structure to obtain the corresponding reference current I02 and reference resistance R02. In an embodiment, the reference temperature T0 is a temperature when the chamber is idle, for example, 25° C.

In S404, when the temperature of the chamber reaches a third temperature, a corresponding third current I21 and a corresponding third resistance R21 are acquired.

The temperature of the chamber is made to reach the third temperature, and the voltage V is applied to the two opposite ends of the second test structure to obtain the corresponding third current I21 and the corresponding third resistance R21.

In S406, when the temperature of the chamber reaches a fourth temperature, a corresponding fourth current I22 and a corresponding fourth resistance R22 are acquired.

The temperature of the chamber is made to reach the fourth temperature, and the voltage V is applied to the two opposite ends of the second test structure to obtain the corresponding fourth current I22 and the corresponding fourth resistance R22.

In S408, current differences of the second test structure at the third temperature and at the fourth temperature are acquired respectively.

A third current difference $\Delta I21$ of the second test structure at the third temperature is acquired according to a difference between the third current I21 and the reference current I02, namely $\Delta I21=I21-I02$; and a fourth current difference $\Delta I22$ of the second test structure at the fourth temperature is acquired according to a difference between the fourth current I22 and the reference current I02, namely $\Delta I22=I22-I02$. Both the third temperature and the fourth temperature are greater than or equal to the minimum critical temperature endurable by the temperature calibrator and less than or equal to the maximum critical temperature endurable by the temperature calibrator.

In S410, temperature differences of the second test structure at the third temperature and at the fourth temperature are acquired respectively.

A difference $\Delta T21$ between a third actual temperature T21 corresponding to the third resistance R21 and T0 (i.e., the temperature difference of the second test structure at the third temperature) is acquired according to a product of a negative of a ratio of the voltage V to the third current difference $\Delta I21$ and a current resolution, namely $\Delta T21=-(V/\Delta I21)*$current resolution; and a difference $\Delta T22$ between a fourth actual temperature T22 corresponding to the fourth resistance R22 and T0 (i.e., the temperature difference of the second test structure at the fourth temperature) is acquired according to a product of a negative of a ratio of the voltage V to the fourth current difference $\Delta I22$ and a current resolution, namely $\Delta T22=-(V/\Delta I22)*$current resolution. The current resolution refers to the accuracy of measuring the current of the second test structure by the test device.

In S412, the second functional relationship between the resistance of the second test structure and the temperature is acquired.

Linear fitting is performed on the reference resistance R02, the third resistance R21, and the fourth resistance R22 as well as the reference temperature T0, the third actual temperature T21, and the fourth actual temperature T22 to obtain the second functional relationship between the resistance R' of the second test structure and the actual temperature T.

In an embodiment, the second functional relationship between the resistance R' of the second test structure and the actual temperature T is obtained by performing linear fitting through the least square method.

In S304, a third functional relationship between a resistance difference of the resistances of the first test structure and the second test structure and an actual temperature is acquired.

The third functional relationship between the resistance difference of the resistances of the first test structure and the second test structure and the actual temperature T is acquired according to the first functional relationship and the second functional relationship.

Figure 7:
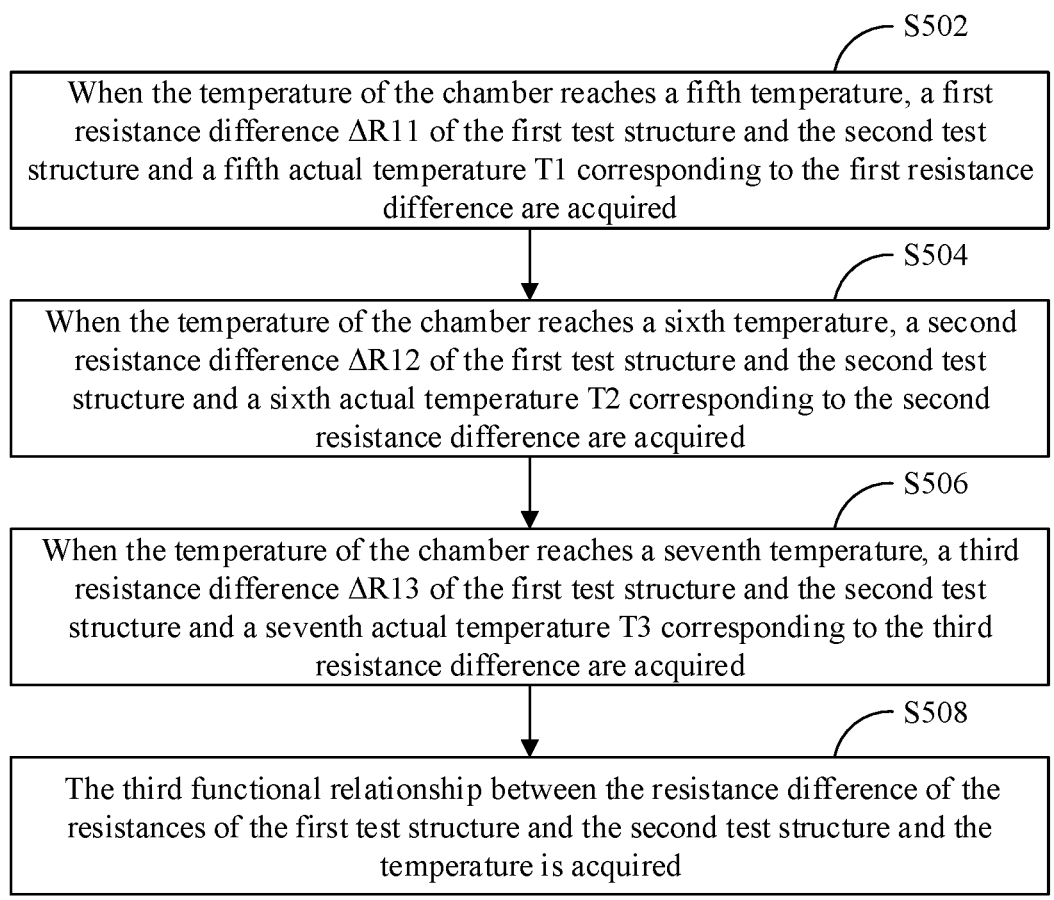
FIG. 7 is a flowchart of acquiring a third functional relationship between a resistance difference of resistances of a first test structure and a second test structure and an actual temperature according to an embodiment.

As shown in FIG. 7, in an embodiment, S304 includes the following operations.

In S502, when the temperature of the chamber reaches a fifth temperature, a first resistance difference $\Delta R11$ of the first test structure and the second test structure and a fifth actual temperature T1 corresponding to the first resistance difference are acquired.

The temperature of the chamber is made to reach the fifth temperature, the voltage V is applied to the two opposite ends of the first test structure and two opposite ends of the second test structure to obtain fifth resistance R31 corresponding to the first test structure and sixth resistance R41 corresponding to the second test structure respectively, and the first resistance difference $\Delta R11$ is acquired according to a difference of the resistance R31 and R41, namely $\Delta R11=R31-R41$. Actual temperatures corresponding to the resistance R31 and R41 are acquired according to the fifth resistance R31 as well as the first functional relationship and the sixth resistance R41 as well as the second functional relationship respectively, and the actual temperatures corresponding to the resistance R31 and R41 are averaged to obtain the fifth actual temperature T1 corresponding to the first resistance difference.

In S504, when the temperature of the chamber reaches a sixth temperature, a second resistance difference $\Delta R12$ of the first test structure and the second test structure and a sixth actual temperature T2 corresponding to the second resistance difference are acquired.

The temperature of the chamber is made to reach the sixth temperature, the voltage V is applied to the two opposite ends of the first test structure and the two opposite ends of the second test structure to obtain seventh resistance R32 corresponding to the first test structure and eighth resistance R42 corresponding to the second test structure respectively, and the second resistance difference $\Delta R12$ is acquired according to a difference of the resistance R32 and R42, namely $\Delta R12=R32-R42$. Actual temperatures corresponding to the resistance R32 and R42 are acquired according to the seventh resistance R32 as well as the first functional relationship and the eighth resistance R42 as well as the second functional relationship respectively, and the actual temperatures corresponding to the resistance R32 and R42 are averaged to obtain the sixth actual temperature T2 corresponding to the second resistance difference.

In S506, when the temperature of the chamber reaches a seventh temperature, a third resistance difference ΔR13 of the first test structure and the second test structure and a seventh actual temperature T3 corresponding to the third resistance difference are acquired.

The temperature of the chamber is made to reach the seventh temperature, the voltage V is applied to the two opposite ends of the first test structure and the two opposite ends of the second test structure to obtain ninth resistance R33 corresponding to the first test structure and tenth resistance R43 corresponding to the second test structure respectively, and the third resistance difference ΔR13 is acquired according to a difference of the resistance R33 and R43, namely ΔR13=R33-R43. Actual temperatures corresponding to the resistance R33 and R432 are acquired according to the ninth resistance R33 as well as the first functional relationship and the tenth resistance R43 as well as the second functional relationship respectively, and the actual temperatures corresponding to the resistance R33 and R43 are averaged to obtain the seventh actual temperature T3 corresponding to the third resistance difference.

In S508, the third functional relationship between the resistance difference of the resistances of the first test structure and the second test structure and the temperature is acquired.

Linear fitting is performed on the first resistance difference ΔR11, the second resistance difference ΔR12, and the third resistance difference ΔR13 as well as the fifth actual temperature T1, the sixth actual temperature T2, and the seventh actual temperature T3 to obtain the third functional relationship between the resistance difference ΔR of the resistances of the first test structure and the second test structure and the actual temperature T.

Figure 8:
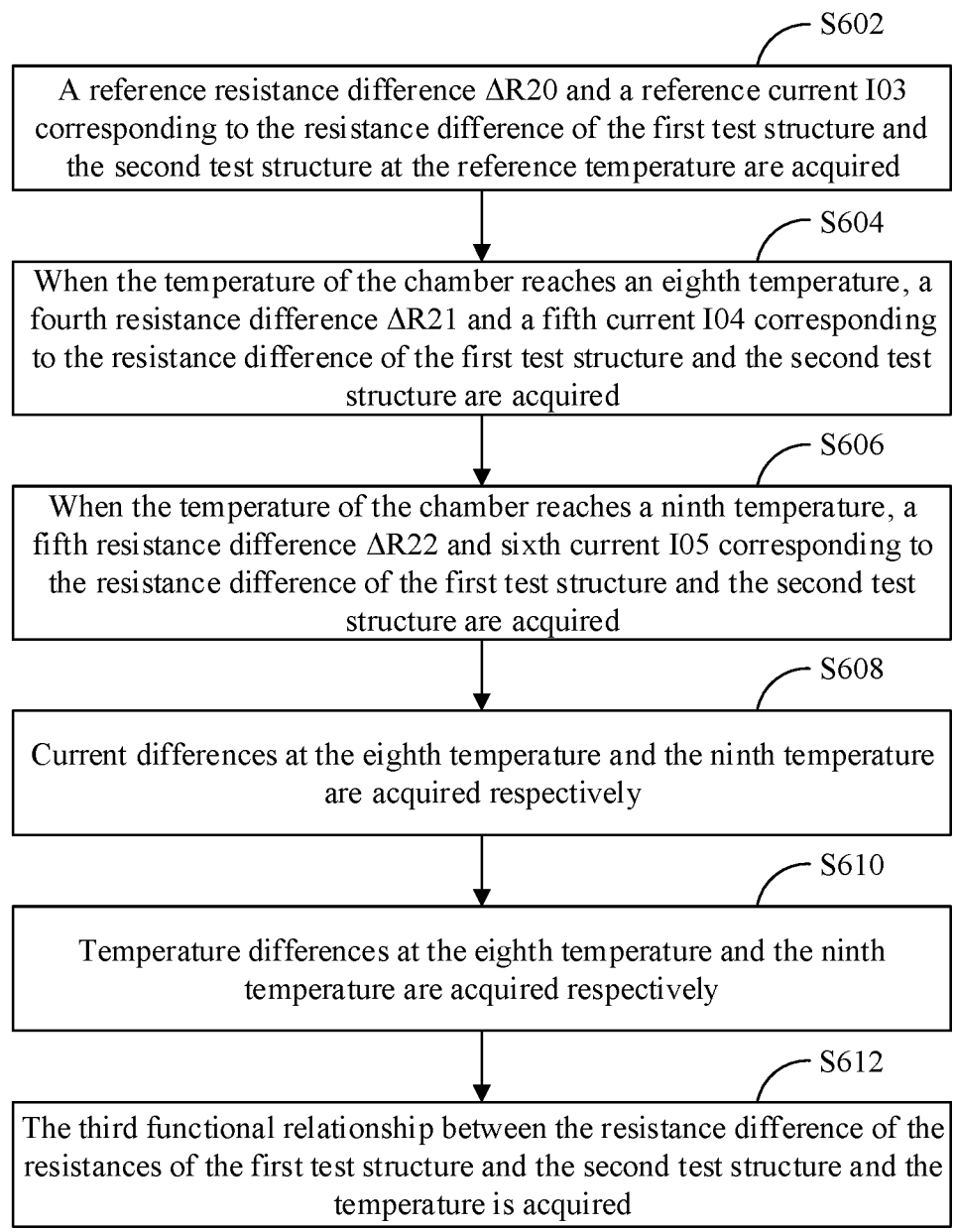
FIG. 8 is a flowchart of acquiring a third functional relationship between a resistance difference of resistances of a first test structure and a second test structure and an actual temperature according to another embodiment.

As shown in FIG. 8, in another embodiment, S304 includes the following operations.

In S602, a reference resistance difference ΔR20 and a reference current I03 corresponding to the resistance difference of the first test structure and the second test structure at the reference temperature are acquired.

At the reference temperature T0, the voltage V is applied to the two opposite ends of the first test structure and the two opposite ends of the second test structure respectively to obtain the resistance difference between the reference resistance corresponding to the first test structure and the reference resistance corresponding to the second test structure as the reference resistance difference ΔR20, and the reference current I03 corresponding to the reference resistance difference ΔR20 is acquired according to the voltage V and the reference resistance difference ΔR20.

In S604, when the temperature of the chamber reaches an eighth temperature, a fourth resistance difference ΔR21 and fifth current I04 corresponding to the resistance difference of the first test structure and the second test structure are acquired.

At the eighth temperature, the voltage V is applied to the two opposite ends of the first test structure and the two opposite ends of the second test structure respectively to obtain the resistance difference between the resistance corresponding to the first test structure and the resistance corresponding to the second test structure as the fourth resistance difference ΔR21, and the fifth current I04 corresponding to the fourth resistance difference ΔR21 is acquired according to the voltage V and the fourth resistance difference ΔR21.

In S606, when the temperature of the chamber reaches a ninth temperature, a fifth resistance difference ΔR22 and sixth current I05 corresponding to the resistance difference of the first test structure and the second test structure are acquired.

At the ninth temperature, the voltage V is applied to the two opposite ends of the first test structure and the two opposite ends of the second test structure respectively to obtain the resistance difference between the resistance corresponding to the first test structure and the resistance corresponding to the second test structure as the fifth resistance difference ΔR22, and the sixth current I05 corresponding to the fifth resistance difference ΔR22 is acquired according to the voltage V and the fifth resistance difference ΔR22.

In S608, current differences at the eighth temperature and the ninth temperature are acquired respectively.

A fifth current difference ΔI04 at the eighth temperature is acquired according to a difference between the fifth current I04 and the reference current I03, namely ΔI04=I04-I03; and a sixth current difference ΔI05 at the ninth temperature is acquired according to a difference between the sixth current I05 and the reference current I03, namely ΔI05=I05-I03. Both the eighth temperature and the ninth temperature are greater than or equal to the minimum critical temperature endurable by the temperature calibrator and less than or equal to the maximum critical temperature endurable by the temperature calibrator.

In S610, temperature differences at the eighth temperature and the ninth temperature are acquired respectively.

A difference ΔT04 between an eighth actual temperature T4 corresponding to the fourth resistance difference ΔR21 and T0 is acquired according to a product of a negative of a ratio of the voltage V to the fifth current difference ΔI04 and the current resolution, namely ΔT04=-(V/ΔI04)*current resolution; and a difference ΔTOS between a ninth actual temperature T5 corresponding to the fifth resistance difference ΔR22 and T0 is acquired according to a product of a negative of a ratio of the voltage V to the sixth current difference ΔI05 and the current resolution, namely ΔT05=-(V/ΔI05)*current resolution. The current resolution refers to the accuracy of measuring the currents of the first test structure and the second test structure by the test device.

In S612, the third functional relationship between the resistance difference of the resistances of the first test structure and the second test structure and the temperature is acquired.

Linear fitting is performed on the reference resistance difference ΔR02, the fourth resistance difference ΔR21, and the fifth resistance difference ΔR22 as well as the reference temperature T0, the eighth actual temperature T4, and the ninth actual temperature T5 to obtain the third functional relationship between the resistance difference ΔR of the resistances of the first test structure and the second test structure and the actual temperature T.

In S306, the resistance difference of the resistances of the first test structure and the second test structure at the set temperature is acquired.

The chamber is made to reach the set temperature, the resistance of the first test structure and the resistance of the second test structure are acquired respectively, and the resistance difference of the resistances of the first test structure and the second test structure is calculated.

In S308, the actual temperature T of the temperature calibrator at the set temperature is acquired.

The actual temperature T of the temperature calibrator at the set temperature is acquired according to the resistance difference of the first test structure and the second test structure and the third functional relationship.

The actual temperature of the calibrator is acquired by using the resistance difference between two test pattern resistances at the same temperature of the chamber, thereby avoiding a measurement error caused by changing of a measurement condition or a measurement device (for example, resistance of a measuring probe), and to enable a deviation of the acquired actual temperature of the calibrator more smaller.

In an embodiment, the method further includes that: the third functional relationship is translated by the reference temperature T0 to obtain a fourth functional relationship between the resistance difference of the resistances of the first test structure and the second test structure and the actual temperature T. That is, the actual temperature T of the third functional relationship is reduced by the temperature T0 to obtain the fourth functional relationship between the resistance difference ΔR of the resistances of the first test structure and the second test structure and the actual temperature T.

Figure 9:
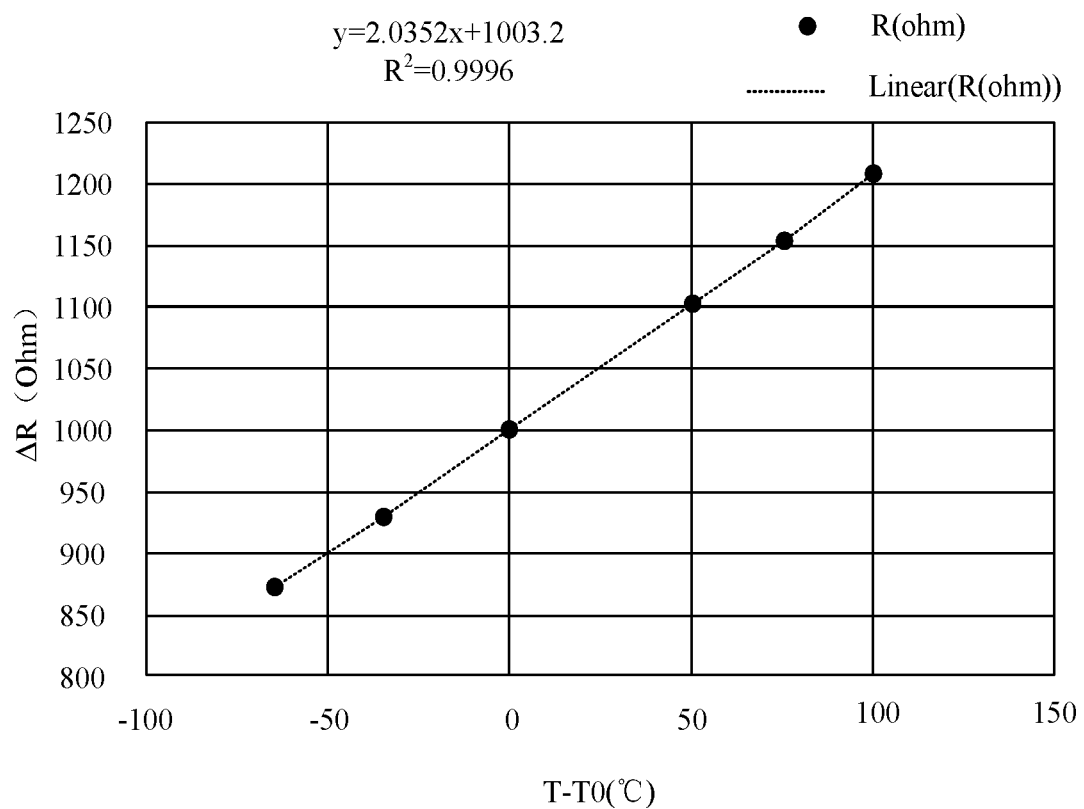
FIG. 9 is a schematic diagram of a fourth functional relationship between a resistance difference of resistances of a first test structure and a second test structure and an actual temperature T according to an embodiment.

FIG. 9 shows the fourth functional relationship between the resistance difference of the resistances of the first test structure and the second test structure and the actual temperature T according to an embodiment. The Y axis is the resistance difference ΔR of the resistances of the first test structure and the second test structure, and the X axis is a difference T−T0 of the actual temperature T and the temperature T0. The fourth functional relationship is y=2.0352x+1003.2. The reliability of the fourth functional relationship is $R^2$=0.9996.

In an embodiment, second linear normalization processing is performed by taking the resistance difference, corresponding to the reference temperature T0, of the resistances of the first test structure and the second test structure as a reference quantity, to obtain a fifth functional relationship between the resistance difference ΔR of the resistances of the first test structure and the second test structure and the actual temperature T.

Figure 10:
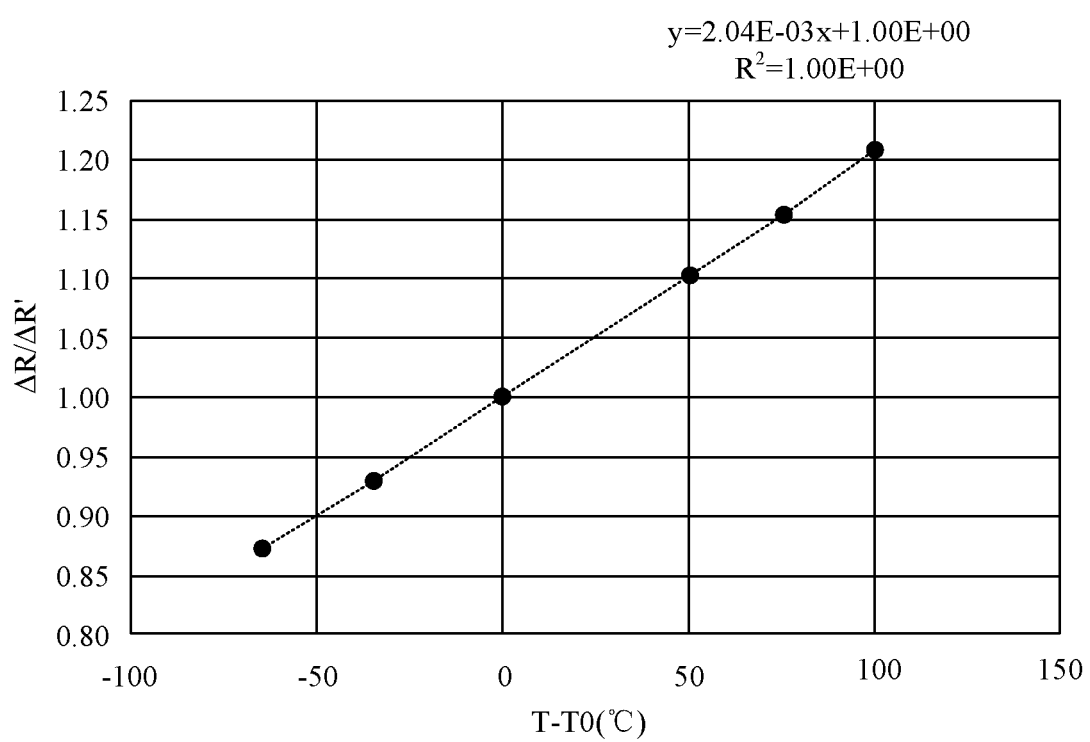
FIG. 10 is a schematic diagram of a fifth functional relationship between a resistance difference of resistances of a first test structure and a second test structure and an actual temperature T according to an embodiment.

FIG. 10 shows the fifth functional relationship between the resistance difference of the resistances of the first test structure and the second test structure and the actual temperature T according to an embodiment. A characteristic, for the temperature, of the resistance difference of the resistances of the first test structure and the second test structure is 2.04e−3 ratio/° C. The Y axis is a ratio of the resistance difference of the resistances of the first test structure and the second test structure to the resistance difference ΔR', corresponding to the reference temperature T0, of the resistances of the first test structure and the second test structure, and the X axis is the difference T−T0 between the measured temperature T and the temperature T0. The fifth functional relationship is y=2.04E−03x+1.00E+00. The reliability of the fifth functional reliability is $R^2$=1.00E+00. If equivalent resistance, i.e., resistance differences, measured at 25° C. and 125° C. is 1,000 ohms and 1,250 ohms respectively, y=1250/1000=1.25, x=(y−1)/2.04E−03=122.546, and T=122.546+25=147.546. It can be seen that the actual temperature T is 147.546° C. at 125° C.

As shown in FIG. 4, when the temperature of the chamber is 25° C., the resistance of the test structure 1 is Rm(25° C.)=R01+CR1, the resistance of the test structure 2 is Rn(25° C.)=R02+CR2, and the resistance difference is Rm−Rn=R01−R02. When the temperature of the chamber is any temperature t unequal to 25° C., Rm(t)−Rn(t)=(R01−R02)*A, where A is a temperature coefficient of the resistance difference of the test structure 1 and the test structure 2 and the resistance difference of the test structure 1 and the test structure 2 at 25° C.

In an embodiment, at least one of the first test structure or the second test structure is a doped polysilicon resistance pattern.

In an embodiment, the voltage is applied to the two ends of the first test structure through a Source Measure Unit (SMU), and a corresponding current is measured. Different SMUs may be used as required by the measurement accuracy. Table 1 shows main specifications of basic SMU modules.

TABLE 1

| Module | HPSMU | MPSMU | HRSMU | ASU |
| --- | --- | --- | --- | --- |
| Maximum driving voltage | ±200 V | ±100 V | ±100 V | ±100 V |
| Maximum driving current | ±1 A | ±100 mA | ±100 mA | ±100 mA |
| Voltage measurement resolution | 2 μV | 0.5 μV | 0.5 μV | 0.5 μV |
| Current measurement resolution | 10 fA | 10 fA | 1 fA | 0.1 fA |

For example, an SMU of which a current resolution is 10 fA (i.e., 1E−14A) is selected, and the resistance difference is 1,000 ohms when the voltage is 1V. In such case, the fourth functional relationship between the resistance difference of the resistances of the first test structure and the second test structure and the actual temperature T is as shown in FIG. 9. According to the fourth functional relationship, it can be seen that, when the temperature rises by 1° C., the resistance rises by 2 ohms, and the current drops by 2.2E−6A. When the current changes by 10 fA, the temperature changes by 4.5E−9° C. That is, in the method for temperature measurement of the disclosure, when the SMU of which the current resolution is 10 fA is used for temperature measurement, the accuracy of the obtained actual temperature is 4.5E−9.

The method for temperature measurement includes that: the temperature calibrator is placed on the stage in the chamber, the temperature calibrator being provided with the first test structure, and the first functional relationship between the resistance of the first test structure and the temperature is acquired; the temperature of the chamber is made to reach the set temperature; the voltage V is applied to the two opposite ends of the first test structure to obtain the current I and resistance R of the first test structure; and the actual temperature T of the temperature calibrator at the set temperature is acquired according to the resistance R and the first functional relationship, the set temperature being greater than or equal to the minimum critical temperature endurable by the temperature calibrator and less than or equal to the maximum critical temperature endurable by the temperature calibrator. According to the technical solution of the disclosure, the temperature calibrator with the first test structure is placed on the stage, the resistance of the first test structure and the temperature having the first functional relationship, the voltage V is applied to the two opposite ends of the first test structure to obtain the current I and resistance R of the first test structure after the temperature of the chamber reaches the set temperature, and the actual temperature T corresponding to the temperature calibrator at the set temperature is acquired according to the resistance R and the first functional relationship. The resistance is acquired using a high-accuracy current resolution to further obtain the actual temperature of the temperature calibrator, so that the accuracy of measuring the actual temperature of the temperature calibrator is improved.

Figure 11:
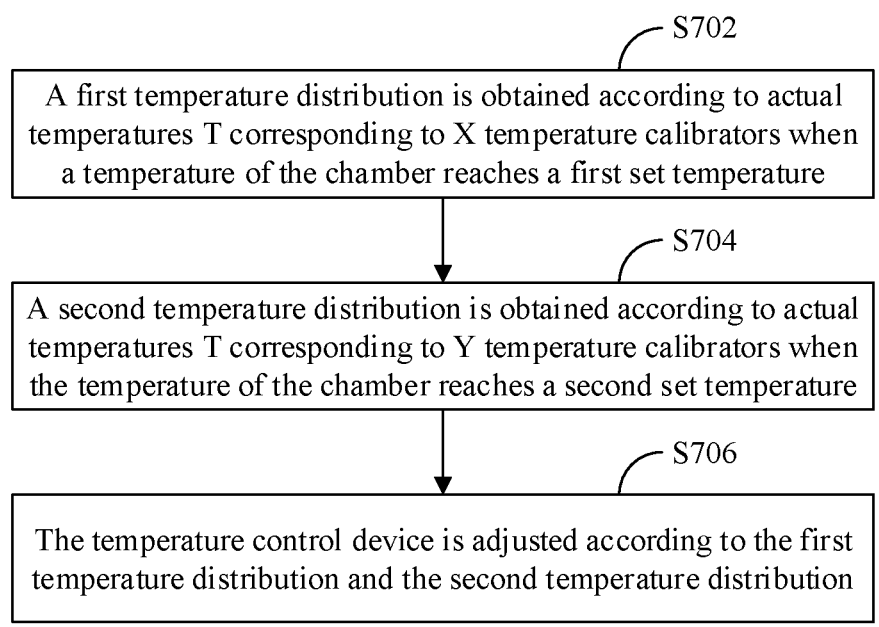
FIG. 11 is a flowchart of a method for temperature calibration according to an embodiment.

As shown in FIG. 11, there is provided in an embodiment a method for temperature calibration, which is used to calibrate a temperature of a process chamber of a semiconductor device. The process chamber of the semiconductor device is provided with a temperature control device. The method for temperature calibration includes an operation that: temperature measurement is performed by using W temperature calibrators, temperature measurement being implemented by using any abovementioned method for temperature measurement. The method for temperature calibration further includes the following operations.

In S702, a first temperature distribution is obtained according to actual temperatures T corresponding to X temperature calibrators when a temperature of the chamber reaches a first set temperature.

In S704, a second temperature distribution is obtained according to actual temperatures T corresponding to Y temperature calibrators when the temperature of the chamber reaches a second set temperature.

In S706, the temperature control device is adjusted according to the first temperature distribution and the second temperature distribution.

The temperature control device is adjusted according to the first temperature distribution and the second temperature distribution to able that all the actual temperatures T corresponding to the X temperature calibrators tend to be the first set temperature when the temperature of the chamber reaches the first set temperature and all the actual temperatures T corresponding to the Y temperature calibrators tend to be the second set temperature when the temperature of the chamber reaches the second set temperature. Both X and Y are less than or equal to W, and the W temperature calibrators are located on a stage.

In an embodiment, the W temperature calibrators include the X temperature calibrators and the Y temperature calibrators.

In an embodiment, the W temperature calibrators are temperature calibrators on a temperature calibration wafer.

In an embodiment, the temperature calibrator is located on a scribe lane of the temperature calibration wafer, and a temperature calibration wafer fragment obtained by cutting may be measured to acquire the actual temperature T corresponding to the temperature calibrator.

In an embodiment, the X temperature calibrators and/or the Y temperature calibrators are uniformly distributed on the stage.

In an embodiment, the X temperature calibrators and/or the Y temperature calibrators are uniformly distributed on the temperature calibration wafer.

In an embodiment, the X temperature calibrators and/or the Y temperature calibrators are located in a central region of the temperature calibration wafer.

The method for temperature calibration is used to calibrate the temperature of the stage of the process chamber of the semiconductor device, the process chamber of the semiconductor device provided with the temperature control device; and includes the operation of temperature measurement by using the W temperature calibrators, temperature measurement being implemented by using any abovementioned method for temperature measurement. The method for temperature calibration further includes that: the first temperature distribution is obtained according to the actual temperatures T corresponding to the X temperature calibrators when the temperature of the chamber reaches the first set temperature; the second temperature distribution is obtained according to the actual temperatures T corresponding to the Y temperature calibrators when the temperature of the chamber reaches the second set temperature; and the temperature control device is adjusted according to the first temperature distribution and the second temperature distribution to able that all the actual temperatures T corresponding to the X temperature calibrators tend to be the first set temperature when the temperature of the chamber reaches the first set temperature and all the actual temperatures T corresponding to the Y temperature calibrators tend to be the second set temperature when the temperature of the chamber reaches the second set temperature, both X and Y being less than or equal to W. According to the technical solution of the disclosure, temperature measurement is performed by using the W temperature calibrators, a voltage V is applied to two opposite ends of a first test structure to obtain a current I and resistance R of the first test structure after the temperature of the chamber reaches a set temperature, and an actual temperature T corresponding to the temperature calibrator at the set temperature is acquired according to the resistance R and the first functional relationship. The resistance is acquired by using a high-accuracy current resolution to further obtain the actual temperature of the temperature calibrator, so that the accuracy of measuring the actual temperature of the temperature calibrator is improved. The first temperature distribution is obtained according to the actual temperatures T corresponding to the X temperature calibrators when the temperature of the chamber reaches the first set temperature, the second temperature distribution is obtained according to the actual temperatures T corresponding to the Y temperature calibrators when the temperature of the chamber reaches the second set temperature, and the temperature control device is adjusted according to the first temperature distribution and the second temperature distribution to able that all the actual temperatures T corresponding to the X temperature calibrators tend to be the first set temperature when the temperature of the chamber reaches the first set temperature and all the actual temperatures T corresponding to the Y temperature calibrators tend to be the second set temperature when the temperature of the chamber reaches the second set temperature, both X and Y being less than or equal to W. A deviation between the actual temperature of the temperature calibrator at a measurement position on the stage and the set temperature is reduced, and the accuracy of calibrating the temperature of the chamber is improved.

There is provided in an embodiment a temperature measurement system, which includes a setting circuit, a temperature control circuit, a measurement circuit, and a calculation circuit.

The setting circuit is configured to set a set temperature of a chamber, a position of a first test structure corresponding to the set temperature, and a voltage V applied to two opposite ends of the first test structure, the first test structure referring to a structure which is located on a temperature calibrator placed on a stage and of which resistance of temperature calibrator forms a first functional relationship with a temperature, and the set temperature being greater than or equal to a minimum critical temperature endurable by the temperature calibrator and less than or equal to a maximum critical temperature endurable by the temperature calibrator.

The temperature control circuit is configured to control a temperature of the chamber to reach the set temperature.

The measurement circuit is configured to apply the voltage V to the two opposite ends of the first test structure to obtain a current I and resistance R of the first test structure at the set temperature.

In an embodiment, the measurement circuit includes an SMU. SMUs of different specifications may be used as required by the measurement accuracy.

The calculation circuit is configured to acquire the first functional relationship, the voltage V, and the resistance R and calculate an actual temperature T corresponding to the temperature calibrator at the set temperature.

In an embodiment, the temperature calibrator further includes a second test structure. The setting circuit is further configured to set a position of the second test structure corresponding to the set temperature and the voltage V applied to two opposite ends of the second test structure, resistance of the second test structure forming a second functional relationship with a temperature.

The measurement circuit is further configured to obtain resistances of the first test structure and the second test structure at the set temperature. The calculation circuit is further configured to acquire the first functional relationship and the second functional relationship and acquire a third functional relationship between a resistance difference of the resistances of the first test structure and the second test structure and an actual temperature according to the first functional relationship and the second functional relationship. The calculation circuit is further configured to, after the resistances of the first test structure and the second test structure are acquired, calculate the resistance difference of the first test structure and the second test structure and acquire the actual temperature T of the temperature calibrator at the set temperature according to the resistance difference and the third functional relationship.

In an embodiment, the setting circuit is further configured to set a reference temperature T0, first temperature, and second temperature of the chamber. The measurement circuit is further configured to apply the voltage V to the two opposite ends of the first test structure and to obtain a reference current I01 and a reference resistance R01 corresponding to the reference temperature T0, a first current I11 and a first resistance R11 corresponding to the first temperature, a second current I12 and a second resistance R12 corresponding to the second temperature respectively. The calculation circuit is further configured to obtain the voltage V, the reference temperature T0, the reference current I01, the first current I11, the second current I12, the reference resistance R01, the first resistance R11, and the second resistance R12, and to acquire a first current difference $\Delta I11$ of the first test structure at the first temperature according to a differences between the first current I11 and the reference current I01, and a second current difference $\Delta I12$ of the first test structure at the second temperature according to a difference between the second current I12 and the reference current I01 respectively. The calculation circuit is further configured to acquire a difference $\Delta T11$ between a first actual temperature T11 corresponding to the first resistance R11 and T0 according to a product of a negative of a ratio of the voltage V to the first current difference $\Delta I11$ and a current resolution, and to acquire a difference $\Delta T12$ between a second actual temperature T12 corresponding to the second resistance R12 and T0 according to a product of a negative of a ratio of the voltage V to the second current difference $\Delta I12$ and a current resolution respectively. The calculation circuit is further configured to perform linear fitting on the reference resistance R01, the first resistance R11, and the second resistance R12 as well as the reference temperature T0, the first actual temperature T11, and the second actual temperature T12 to obtain the first functional relationship between the resistance R of the first test structure and the actual temperature T, the current resolution referring to the accuracy of measuring the current of the first test structure by the measurement circuit, and both the first temperature and the second temperature being greater than or equal to the minimum critical temperature endurable by the temperature calibrator and a less than or equal to the maximum critical temperature endurable by the temperature calibrator.

In an embodiment, the setting circuit is further configured to set the reference temperature T0, a third temperature, and a fourth temperature of the chamber. The measurement circuit is further configured to apply the voltage V to the two opposite ends of the second test structure and to obtain a reference current I02 and a reference resistance R02 corresponding to the reference temperature T0, a third current I21 and a third resistance R21 corresponding to the third temperature, and a fourth current I22 and a fourth resistance R22 corresponding to the fourth temperature respectively. The calculation circuit is further configured to obtain the voltage V, the reference temperature T0, the reference current I02, the third current I21, the fourth current I22, the reference resistance R02, the third resistance R21, and the fourth resistance R22, and to acquire a third current difference $\Delta I21$ of the second test structure at the third temperature according to a difference between the third current I21 and the reference current I02, and a fourth current difference $\Delta I22$ of the second test structure at the fourth temperature according to a difference between the fourth current I22 and the reference current I02 respectively. The calculation circuit is further configured to acquire a difference $\Delta T21$ between a third actual temperature T21 corresponding to the third resistance R21 and T0 according to a product of a negative of a ratio of the voltage V to the third current difference $\Delta I21$ and a current resolution; and a difference $\Delta T22$ between a fourth actual temperature T22 corresponding to the fourth resistance R22 and T0 according to a product of a negative of a ratio of the voltage V to the fourth current difference $\Delta I22$ and a current resolution respectively. The calculation circuit is further configured to perform linear fitting on the reference resistance R02, the third resistance R21, and the fourth resistance R22 as well as the reference temperature T0, the third actual temperature T21, and the fourth actual temperature T22 to obtain the second functional relationship between the resistance R' of the second test structure and the actual temperature T, the current resolution referring to the accuracy of measuring the current of the second test structure by the measurement circuit, and both the third temperature and the fourth temperature being greater than or equal to the minimum critical temperature endurable by the temperature calibrator and a less than or equal to the maximum critical temperature endurable by the temperature calibrator.

In an embodiment, the temperature measurement system further includes a transmission circuit, and the transmission circuit is configured to place the temperature calibrator on the stage in the chamber.

The temperature measurement system includes the setting circuit, the temperature control circuit, the measurement circuit, and the calculation circuit. The setting circuit is configured to set the set temperature of the chamber, the position of the first test structure corresponding to the set temperature, and the voltage V applied to the two opposite ends of the first test structure, the first test structure referring to a structure which is located on the temperature calibrator placed on the stage and of which the resistance of temperature calibrator forms the first functional relationship with the temperature. The temperature control circuit is configured to control the temperature of the chamber to reach the set temperature. The measurement circuit is configured to apply the voltage V to the two opposite ends of the first test structure to obtain the current I and resistance R of the first test structure at the set temperature. The calculation circuit is configured to acquire the first functional relationship, the voltage V, and the resistance R, and to calculate the actual temperature T corresponding to the temperature calibrator at the set temperature, the set temperature being greater than or equal to the minimum critical temperature endurable by the temperature calibrator and less than or equal to the maximum critical temperature endurable by the temperature calibrator. According to the technical solution of the disclosure, the set temperature of the chamber, the position of the first test structure at the set temperature, and the voltage V applied to the two opposite ends of the first test structure are set through the setting circuit, the first test structure referring to a structure which is located on the temperature calibrator placed on the stage in the chamber and of which the resistance of temperature calibrator forms the first functional relationship with the temperature; the measurement circuit applies the voltage V to the two opposite ends of the first test structure to obtain the current I and resistance R of the first test structure at the set temperature; and through the calculation circuit, the first functional relationship, the voltage V and the resistance R are acquired, and the actual temperature T corresponding to the temperature calibrator at the set temperature is calculated. The resistance is acquired by using a high-accuracy current resolution to further obtain the actual temperature of the temperature calibrator, so that the accuracy of measuring the actual temperature of the temperature calibrator is improved.

The technical features of the above embodiments may be combined arbitrarily. In order to simplify the description, all possible combinations of the technical features in the above embodiments are not completely described. However, as long as there is no conflict between these technical features, they should be considered to be within the scope of this specification.

The above embodiments merely describe a few implementations of the present disclosure, and the descriptions are specific and detailed, but cannot therefore be construed to limit the patent scope of the present disclosure. It should be noted that those of ordinary skill in the art may further make several variations and improvements without departing from the conception of the present disclosure, which fall within the protection scope of the present disclosure. Therefore, the patent protection scope of the present disclosure should be subject to the appended claims.

What is claimed is:

1. A method for temperature measurement, comprising:
   placing a temperature calibrator on a stage in a chamber, the temperature calibrator being provided with a first test structure, and acquiring a first functional relationship between resistance R of the first test structure and an actual temperature T;
   making a temperature of the chamber to reach a set temperature, wherein the set temperature comprises a reference temperature $T0$, a first actual temperature $T11$ and a second actual temperature $T12$;
   applying a voltage V to two opposite ends of the first test structure to obtain a current I and a resistance R of the first test structure, wherein the current I and the resistance R comprise a first reference current $I01$ and a first reference resistance $R01$ at the reference temperature $T0$, a first current $I11$ and a first resistance $R11$ at the first actual temperature $T11$ and a second current $I12$ and a second resistance $R12$ at the second actual temperature $T12$;
   acquiring a first current difference $\Delta I11$ of the first test structure at the first actual temperature $T11$ according to a difference between the first current $I11$ and the first reference current $I01$, and a second current difference $\Delta I12$ of the first test structure at the second actual temperature $T12$ according to a difference between the second current $I12$ and the first reference current $I01$ respectively;
   acquiring a difference $\Delta T11$ between the first actual temperature $T11$ and the reference temperature $T0$ according to a product of a negative of a ratio of the voltage V to the first current difference $\Delta I11$ and a first current resolution, and a difference $\Delta T12$ between the second actual temperature $T12$ and the reference temperature $T0$ according to a product of a negative of a ratio of the voltage V to the second current difference $\Delta I12$ and the first current resolution respectively;
   performing linear fitting on the first reference resistance $R01$, the first resistance $R11$, the second resistance $R12$, the reference temperature $T0$, the first actual temperature $T11$, and the second actual temperature $T12$ to obtain the first functional relationship between the resistance R of the first test structure and the actual temperature T; and
   acquiring an actual temperature T corresponding to the temperature calibrator at the set temperature according to the resistance R and the first functional relationship,
   wherein the set temperature is greater than or equal to a minimum critical temperature endurable by the temperature calibrator and is less than or equal to a maximum critical temperature endurable by the temperature calibrator;
   wherein the first current resolution refers to an accuracy of measuring a current of the first test structure by a test device;
   wherein the temperature calibrator is operable and not destroyed at the set temperature ranging from the minimum critical temperature endurable by the temperature calibrator to the maximum critical temperature endurable by the temperature calibrator.

2. The method of claim 1, wherein the temperature calibrator further comprises a second test structure, and the method further comprises:
   acquiring a second functional relationship between a resistance R' of the second test structure and the actual temperature T;
   acquiring a third functional relationship between a resistance difference between a resistance of the first test structure and a resistance of the second test structure and the actual temperature T according to the first functional relationship and the second functional relationship;
   making the chamber to reach the set temperature, acquiring the resistance of the first test structure and the resistance of the second test structure respectively, and calculating the resistance difference between the resistance of the first test structure and the resistance of the second test structure; and
   acquiring the actual temperature T corresponding to the temperature calibrator at the set temperature according to the resistance difference of the first test structure and the second test structure and the third functional relationship;

wherein an operation of acquiring the second functional relationship between the resistance R' of the second test structure and the actual temperature T comprises:

applying the voltage V to two opposite ends of the second test structure to obtain a second reference current I02 and a second reference resistance R02 at the reference temperature T0, a third current I21 and a third resistance R21 at a third actual temperature T21 and a fourth current I22 and a fourth resistance R22 at a fourth actual temperature T22;

acquiring a third current difference ΔI21 of the second test structure at the third actual temperature T21 according to a difference between the third current I21 and the second reference current I02, and a fourth current difference ΔI22 of the second test structure at the fourth actual temperature T22 according to a difference between the fourth current I22 and the second reference current I02 respectively;

acquiring a difference ΔT21 between the third actual temperature T21 and the reference temperature T0 according to a product of a negative of a ratio of the voltage V to the third current difference ΔI21 and a second current resolution, and a difference ΔT22 between the fourth actual temperature T22 and the reference temperature T0 according to a product of a negative of a ratio of the voltage V to the fourth current difference ΔI22 and the second current resolution respectively;

performing linear fitting on the second reference resistance R02, the third resistance R21, and the fourth resistance R22, the reference temperature T0, the third actual temperature T21, and the fourth actual temperature T22 to obtain the second functional relationship between the resistance R' of the second test structure and the actual temperature T;

wherein the third actual temperature T21 and the fourth actual temperature T22 are greater than or equal to the minimum critical temperature endurable by the temperature calibrator and are less than or equal to the maximum critical temperature endurable by the temperature calibrator;

wherein the second current resolution refers to an accuracy of measuring a current of the second test structure by the test device.

3. A method for temperature calibration, used to calibrate a temperature of a stage in a process chamber of a semiconductor device, wherein the process chamber of the semiconductor device is provided with a temperature control device; and the method for temperature calibration comprises an operation of performing temperature measurement by using W temperature calibrators, the temperature measurement being implemented by using the method for temperature measurement of claim 1, the method for temperature calibration further comprising:

obtaining a first temperature distribution according to actual temperatures T corresponding to X temperature calibrators when a temperature of the chamber reaches a first set temperature;

obtaining a second temperature distribution according to actual temperatures T corresponding to Y temperature calibrators when the temperature of the chamber reaches a second set temperature; and adjusting the temperature control device according to the first temperature distribution and the second temperature distribution to able that all of the actual temperatures T corresponding to the X temperature calibrators tend to be the first set temperature when the temperature of the chamber reaches the first set temperature and all of the actual temperatures T corresponding to the Y temperature calibrators tend to be the second set temperature when the temperature of the chamber reaches the second set temperature;

wherein X is less than or equal to W and Y is less than or equal to W.

4. The method of claim 3, wherein the X temperature calibrators and/or the Y temperature calibrators are uniformly distributed on the stage.

5. A system for temperature measurement, comprising:

a setting circuit, configured to set a set temperature of a chamber, a position of a first test structure corresponding to the set temperature, and a voltage V applied to two opposite ends of the first test structure, the first test structure referring to a structure which is located on a temperature calibrator placed on a stage and of which a resistance R of the temperature calibrator forms a first functional relationship with an actual temperature T;

a temperature control circuit, configured to control a temperature of the chamber to reach the set temperature, wherein the set temperature comprises a reference temperature T0, a first actual temperature T11 and a second actual temperature T12;

a measurement circuit, configured to apply the voltage V to the two opposite ends of the first test structure to obtain a current I and a resistance R of the first test structure at the set temperature, wherein the current I and the resistance R comprise a first reference current I01 and a first reference resistance R01 at the reference temperature T0, a first current I11 and a first resistance R11 at the first actual temperature T11 and a second current I12 and a second resistance R12 at the second actual temperature T12; and a calculation circuit, configured to acquire the voltage V, the resistance R, the reference temperature T0, the first reference current I01, the first current I11, the second current I12, the first reference resistance R01, the first resistance R11, and the second resistance R12;

the calculation circuit is further configured to acquire a first current difference ΔI11 of the first test structure at the first actual temperature T11 according to a difference between the first current I11 and the first reference current I01, and a second current difference ΔI12 of the first test structure at the second actual temperature T12 according to a difference between the second current I12 and the first reference current I01 respectively;

the calculation circuit is further configured to acquire a difference ΔT11 between the first actual temperature T11 and the reference temperature T0 according to a product of a negative of a ratio of the voltage V to the first current difference ΔI11 and a first current resolution, and a difference ΔT12 between the second actual temperature T12 and the reference temperature T0 according to a product of a negative of a ratio of the voltage V to the second current difference ΔI12 and the first current resolution respectively;

the calculation circuit is further configured to perform linear fitting on the first reference resistance R01, the first resistance R11, the second resistance R12, the reference temperature T0, the first actual temperature T11, and the second actual temperature T12 to obtain the first functional relationship between the resistance R of the first test structure and the actual temperature T;

the calculation circuit is further configured to acquire the actual temperature T corresponding to the temperature calibrator at the set temperature according to the resistance R and the first functional relationship;

wherein the set temperature is greater than or equal to a minimum critical temperature endurable by the temperature calibrator and is less than or equal to a maximum critical temperature endurable by the temperature calibrator;

wherein the first current resolution refers to an accuracy of measuring a current of the first test structure by the measurement circuit;

wherein the temperature calibrator is operable and not destroyed at the set temperature ranging from the minimum critical temperature endurable by the temperature calibrator to the maximum critical temperature endurable by the temperature calibrator.

6. The system of claim 5, wherein the temperature calibrator further comprises a second test structure;

the setting circuit is further configured to set the reference temperature T0, a third actual temperature T21, and a fourth actual temperature T22 of the chamber, a position of the second test structure corresponding to the set temperature, and to set the voltage V applied to two opposite ends of the second test structure, a resistance R' of the second test structure forming a second functional relationship with the actual temperature T;

the measurement circuit is further configured to obtain a resistance of the first test structure and a resistance of the second test structure at the set temperature;

the measurement circuit is further configured to apply the voltage V to the two opposite ends of the second test structure to obtain a second reference current I02 and a second reference resistance R02 at the reference temperature T0, a third current I21 and a third resistance R21 at the actual temperature T21, and a fourth current I22 and a fourth resistance R22 at the fourth actual temperature T22 respectively; and the calculation circuit is further configured to acquire the first functional relationship and the second functional relationship, and to acquire a third functional relationship between a resistance difference between the resistance of the first test structure and the resistance of the second test structure and the actual temperature T according to the first functional relationship and the second functional relationship;

the calculation circuit is further configured to obtain the voltage V, the reference temperature T0, the second reference current I02, the third current I21, the fourth current I22, the second reference resistance R02, the third resistance R21, and the fourth resistance R22; and to acquire a third current difference $\Delta$I21 of the second test structure at the third actual temperature T21 according to a difference between the third current I21 and the second reference current I02, and a fourth current difference $\Delta$I22 of the second test structure at the fourth actual temperature T22 according to a difference between the fourth current I22 and the second reference current I02 respectively;

the calculation circuit is further configured to acquire a difference $\Delta$T21 between the third actual temperature T21 and the reference temperature T0 according to a product of a negative of a ratio of the voltage V to the third current difference $\Delta$I21 and a second current resolution, and a difference $\Delta$T22 between the fourth actual temperature T22 and the reference temperature T0 according to a product of a negative of a ratio of the voltage V to the fourth current difference $\Delta$I22 and the second current resolution respectively;

the calculation circuit is further configured to perform linear fitting on the second reference resistance R02, the third resistance R21, and the fourth resistance R22, the reference temperature T0, the third actual temperature T21, and the fourth actual temperature T22 to obtain the second functional relationship between the resistance R' of the second test structure and the actual temperature T;

the calculation circuit is further configured to, after the resistance of the first test structure and the resistance of the second test structure is acquired, calculate the resistance difference between the resistance of the first test structure and the resistance of the second test structure; and acquire the actual temperature T corresponding to the temperature calibrator at the set temperature according to the resistance difference of the first test structure and the second test structure and the third functional relationship;

wherein the third actual temperature T21 and the fourth actual temperature T22 are greater than or equal to the minimum critical temperature endurable by the temperature calibrator and are less than or equal to the maximum critical temperature endurable by the temperature calibrator;

wherein the second current resolution refers to an accuracy of measuring a current of the second test structure by the measurement circuit.

* * * * *